(12) United States Patent
Steidl et al.

(10) Patent No.: US 9,905,995 B2
(45) Date of Patent: Feb. 27, 2018

(54) ADJUSTABLE TERMINATION CIRCUIT FOR HIGH SPEED LASER DRIVER

(71) Applicant: Integrated Device Technology, Inc., San Jose, CA (US)

(72) Inventors: Samuel Aloysius Steidl, Palo Alto, CA (US); Emad Afifi, San Jose, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 15/252,877

(22) Filed: Aug. 31, 2016

(65) Prior Publication Data

US 2017/0063036 A1    Mar. 2, 2017

Related U.S. Application Data

(60) Provisional application No. 62/213,024, filed on Sep. 1, 2015.

(51) Int. Cl.
*H01S 5/042* (2006.01)
*H01S 5/062* (2006.01)

(52) U.S. Cl.
CPC ........ *H01S 5/0427* (2013.01); *H01S 5/06226* (2013.01)

(58) Field of Classification Search
CPC ............................ H01S 5/0427; H01S 5/06226
See application file for complete search history.

(56) References Cited

U.S. PATENT DOCUMENTS

| 5,060,220 | A | 10/1991 | Lee |
| 5,736,844 | A | 4/1998 | Yanagisawa |
| 2004/0222844 | A1 | 11/2004 | Doorenbos et al. |
| 2005/0168278 | A1 | 8/2005 | Chung |
| 2007/0040716 | A1 | 2/2007 | Lin et al. |
| 2007/0098026 | A1 | 5/2007 | Uesaka et al. |
| 2011/0051764 | A1 | 3/2011 | Kamatani |
| 2012/0294324 | A1 | 11/2012 | Miyajima et al. |

FOREIGN PATENT DOCUMENTS

JP    2012-89564    * 5/2012

OTHER PUBLICATIONS

PCT/US2016/049644, International Search Report (PCT/ISA/220 and PCT/ISA/210) dated Nov. 15, 2016, enclosing Written Opinion of the International Searching Authority (PCT/ISA/237) (Ten (10) pages).

* cited by examiner

*Primary Examiner* — Dung Nguyen
(74) *Attorney, Agent, or Firm* — Haynes and Boone, LLP

(57) ABSTRACT

Disclosed is a circuit having a high speed laser driver circuit, a semiconductor laser electrically connected to the high speed laser driver circuit, and an adjustable termination circuit electrically connected between the high speed laser driver circuit and the semiconductor laser, where the adjustable termination circuit is configured to control an output impedance seen by the semiconductor laser as a function of an input current provided to the adjustable termination circuit.

12 Claims, 1 Drawing Sheet

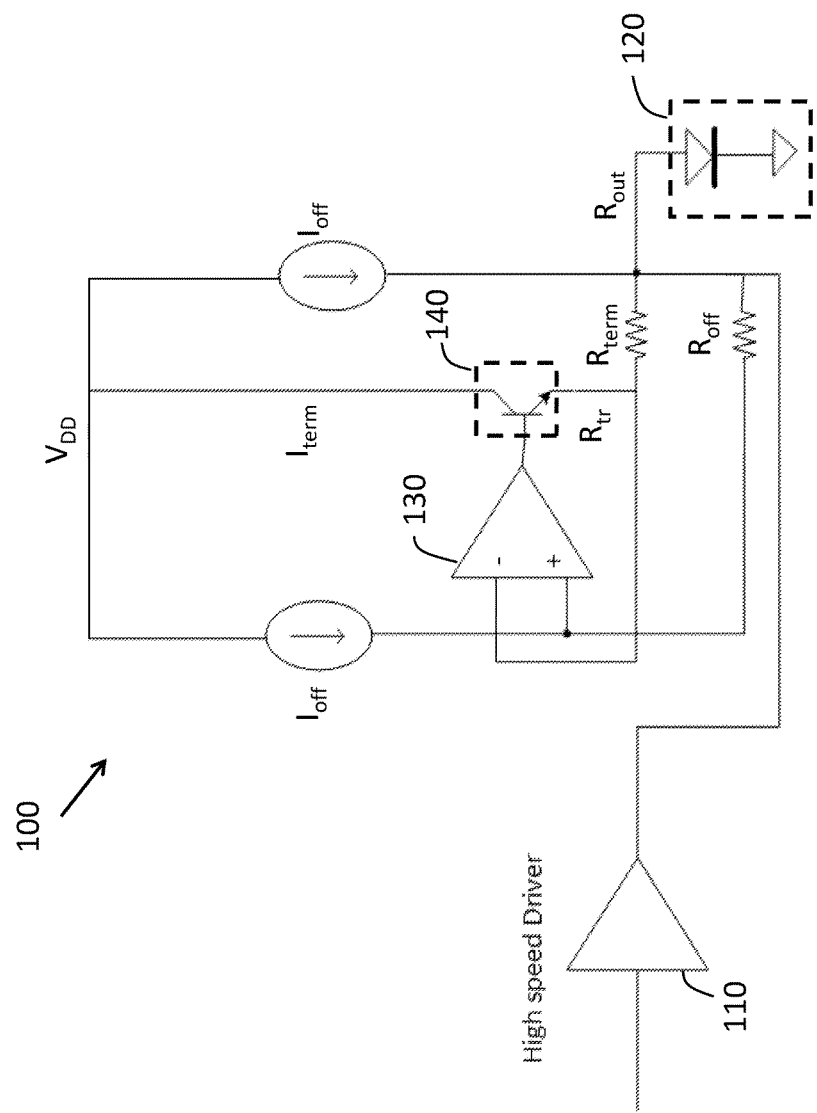

ADJUSTABLE TERMINATION CIRCUIT FOR HIGH SPEED LASER DRIVER

CROSS REFERENCE TO RELATED APPLICATION

This application claims the benefit of U.S. Provisional Application No. 62/213,024, filed Sep. 1, 2015, the contents of which are incorporated herein by reference in its entirety.

FIELD OF THE INVENTION

The present invention relates to high speed laser drivers for optical communication and, in particular, to high speed laser drivers for optical communication in which special circuitry is used to stabilize the output impedance at the output node, while being able to control the output impedance, thereby providing good bandwidth control.

BACKGROUND

High speed laser drivers for optical communication deliver electrical signals to a directly coupled semiconductor laser. Such electrical signals consist of a high speed switching signal, plus a direct current (DC) bias current. The bandwidth of drivers depend on the parasitics at the output node and output impedance of the bias circuit.

Currently, in order to prevent the degradation of the signal quality due to impedance mismatching between the semiconductor laser and the laser driver, laser drivers are configured to adjust the output impedance to match the transmission impedance by providing a termination resistor. However, such a fixed resistance provides less than ideal output impedance stability and bandwidth control. The output impedance depends on the output impedance of the bias current source which depends on process and supply voltage, so having a fixed resistor might not be optimum at all operating conditions. Adding the control over this impedance enables optimization of the termination resistance to obtain the best performance.

As such, there is a need in the art for an improved circuit design for high speed laser drivers for optical communication having improved output impedance stability and improved bandwidth control.

SUMMARY OF THE INVENTION

Disclosed and claimed herein is laser driver circuitry and an adjustable termination circuit for controlling an output impedance seen by a semiconductor laser in which the adjustable termination circuit is electrically connected between a high speed laser driver circuit and the semiconductor laser.

In certain embodiments, the adjustable termination circuit includes a power source configured to provide an input current, an offset resistor, and an operational amplifier in which one of its inputs is electrically connected in series between the power source and the offset resistor such that the input current provided by the power source to the offset resistor generates an input offset voltage across the inputs of the operational amplifier. The operational amplifier may then be configured to drive such input offset voltage to zero.

The adjustable termination circuit further includes a transistor having a base terminal electrically connected to an output of the operational amplifier, and a termination resistor electrically connected between an emitter terminal of the transistor and the semiconductor laser. In certain embodiments, the operational amplifier is configured to induce the transistor to provide a termination current in response to the input offset voltage at the input of the operational amplifier, where the transistor provides a transistor impedance that is a function of the termination current.

The total output impedance seen by the semiconductor laser is equal to the summation of an impedance of the termination resistor and the transistor impedance, and therefore is adjustable as a function of the input current.

Other aspects, features, and techniques of the invention will be apparent to one skilled in the relevant art in view of the following detailed description of the invention.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein:

FIG. 1 is a is a circuit diagram showing a driver for a semiconductor laser according to one embodiment of the present invention.

DETAILED DESCRIPTION OF THE EXEMPLARY EMBODIMENTS

One aspect of the invention disclosed herein is to provide a circuit that stabilizes the output impedance at the output node, while being able to control the output impedance. This enables good control over the bandwidth.

The present disclosure generally relates to an adjustable termination circuit for controlling an output impedance seen by a semiconductor laser, wherein the adjustable termination circuit is electrically connected between a high speed laser driver circuit and the semiconductor laser.

The adjustable termination circuit of the present disclosure comprises a power source configured to provide an input current, an offset resistor, an operational amplifier electrically connected in series between the power source and the offset resistor, a transistor having a base terminal electrically connected to an output of the operational amplifier, and a termination resistor electrically connected between an emitter terminal of the transistor and the semiconductor laser.

The aforementioned operational amplifier is configured to drive an offset voltage across inputs to the operational amplifier to zero, wherein one of the inputs to the operational amplifier is such that the input current provided by the power source to the offset resistor generates the input offset voltage across the inputs of the operational amplifier;

In certain embodiments, the operational amplifier is configured to induce the transistor to provide a termination current in response to the input offset voltage at the input of the operational amplifier. The output impedance seen by the semiconductor laser is then equal to the summation of the resulting transistor impedance and the impedance of the termination resistor.

With reference to FIG. 1, depicted is one embodiment of the invention which comprises an adjustable termination circuit 100 between a high speed laser driver 110 and a semiconductor laser 120.

As shown, adjustable termination circuit 100 comprises an input current ($I_{off}$), which may be provided by a power source (not shown) to the offset resistor ($R_{off}$) so as to generate an offset voltage across the inputs of the operational amplifier (op-amp) 130. The power source may comprise a digital-to-analog converter. In certain embodiments, the op-amp 130 is configured drive any input offset voltage to zero. Since one input terminal of op-amp 130 receives the input current ($I_{off}$), an offset voltage across the inputs of the op-amp 130 may be generated by the input current ($I_{off}$), which in turn will induce a current in transistor 140 which, in turn, can be used to vary the output impedance ($R_{out}$) as desired for operation of the semiconductor laser 120.

Specifically, as shown in FIG. 1, the ability of the adjustable termination circuit 100 to vary output impedance ($R_{out}$) is based on the fact that the output impedance ($R_{out}$) seen by the semiconductor laser 120 is a function of the transistor's impedance seen at its emitter terminal ($R_{tr}$) in the case of a bipolar transistor, or at the transistor's source in case of an NMOS transistor. The total output impedance ($R_{out}$) is the summation of the impedance provided by the termination resistor ($R_{term}$) and the transistor's impedance seen at its emitter ($R_{tr}$).

If the output impedance ($R_{out}$) is to be reduced, for example, this may be achieved by inducing an offset voltage between the inputs of the op-amp 130, as noted above, by injecting current $I_{off}$ into resistor $R_{off}$. This offset voltage results in a current in the transistor 140 equal to the following:

$$I_{term} = \frac{I_{off} * R_{off}}{R_{term}}$$

where,
$R_{off}$=offset resistor,
$R_{term}$=termination resistor,
$I_{term}$=DC current flowing through the termination resistor ($R_{term}$),
$I_{off}$=input current flowing through the offset resistor ($R_{off}$),
$R_{tr}$=is the impedance at the emitter of the transistor 140.

Once $I_{term}$ is calculated, Ohm's law provides the transistor's impedance seen at its emitter (in the case of a bipolar transistor) ($R_{tr}$), as shown in the following equation:

$$R_{tr} = \frac{V_{term}}{I_{term}}$$

where,
$V_{term}$=supply voltage of the power source.

From the transistor's impedance ($R_{tr}$), the total output impedance ($R_{out}$) may then be calculated as follows:

$$R_{out}=R_{tr}+R_{term}$$

By using the novel circuit architecture of FIG. 1, the output impedance ($R_{out}$) seen by the semiconductor laser 120 can not only be matched to the transmission impedance, for example, but can also be kept in a small range such that the bandwidth is well controlled and adequate for the desired range of operation.

In accordance with the above, the present disclosure relates to an adjustable termination circuit for controlling an output impedance seen by a semiconductor laser, wherein the adjustable termination circuit is electrically connected between a high speed laser driver circuit (e.g., driver 110) and the semiconductor laser.

With respect to the aforementioned transistor, it should be appreciated the transistor may be a bipolar transistor, in which case the resulting transistor impedance that is a function of the termination current would be seen at the emitter terminal. Alternatively, the transistor may be a NMOS transistor, in which case the resulting transistor impedance would be seen at the source terminal of the transistor. In either case, however, the output impedance seen by the semiconductor laser would be equal to the summation of the resulting transistor impedance and the impedance of the termination resistor.

While certain exemplary embodiments have been described and shown in the accompanying drawing, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A circuit comprising:
   a high speed laser driver circuit;
   a semiconductor laser electrically connected to the high speed laser driver circuit; and
   an adjustable termination circuit electrically connected between the high speed laser driver circuit and the semiconductor laser, wherein the adjustable termination circuit is configured to control an output impedance seen by the semiconductor laser as a function of an input current provided to the adjustable termination circuit,
   wherein the adjustable termination circuit comprises an operational amplifier configured to drive an input offset voltage, across inputs to the operational amplifier, to zero,
   wherein one of the inputs to the operational amplifier is electrically connected in series between a power source and an offset resistor,
   wherein the power source is configured to provide an input current to the offset resistor, thereby generating the input offset voltage across the inputs of the operational amplifier, and
   wherein the operational amplifier comprises an output electrically connected to a base terminal of a transistor, wherein an emitter terminal of the transistor is electrically connected to a termination resistor.

2. The circuit of claim 1, wherein the termination resistor is electrically connected between the transistor and the semiconductor laser.

3. The circuit of claim 2, wherein the operational amplifier is configured to induce the transistor to provide a termination current in response to the input offset voltage at the input of the operational amplifier.

4. The circuit of claim 3, wherein the transistor is a bipolar transistor having a transistor impedance at the emitter terminal that is a function of the termination current.

5. The circuit of claim 3, wherein the transistor is a NMOS transistor having a transistor impedance at a source terminal that is a function of the termination current.

6. The circuit of claim 4, wherein the output impedance seen by the semiconductor laser is equal to the summation of an impedance of the termination resistor and the transistor impedance.

7. The circuit of claim 5, wherein the output impedance seen by the semiconductor laser is equal to the summation of an impedance of the termination resistor and the transistor impedance.

8. An adjustable termination circuit for controlling an output impedance seen by a semiconductor laser, wherein the adjustable termination circuit is electrically connected between a high speed laser driver circuit and the semiconductor laser, wherein the adjustable termination circuit comprises:

a power source configured to provide an input current;

an offset resistor;

an operational amplifier configured to drive an input offset voltage, across inputs to the operational amplifier, to zero, wherein one of the inputs to the operational amplifier is electrically connected in series between the power source and the offset resistor such that the input current provided by the power source to the offset resistor generates the input offset voltage across the inputs of the operational amplifier;

a transistor having a base terminal electrically connected to an output of the operational amplifier; and a termination resistor electrically connected between an emitter terminal of the transistor and the semiconductor laser, wherein the operational amplifier is configured to induce the transistor to provide a termination current in response to the input offset voltage at the input of the operational amplifier, wherein a transistor impedance of the transistor is based on the termination current, and wherein the output impedance seen by the semiconductor laser is a function of the transistor impedance and is therefore adjustable as a function of the input current.

9. The adjustable termination circuit of claim 8, wherein the transistor is a bipolar transistor having a transistor impedance at the emitter terminal that is a function of the termination current.

10. The adjustable termination circuit of claim 8, wherein the transistor is a NMOS transistor having a transistor impedance at a source terminal that is a function of the termination current.

11. The adjustable termination circuit of claim 9, wherein the output impedance seen by the semiconductor laser is equal to the summation of an impedance of the termination resistor and the transistor impedance.

12. The adjustable termination circuit of claim 10, wherein the output impedance seen by the semiconductor laser is equal to the summation of an impedance of the termination resistor and the transistor impedance.

* * * * *